US007299435B2

United States Patent
Cui et al.

(10) Patent No.: US 7,299,435 B2
(45) Date of Patent: Nov. 20, 2007

(54) FREQUENCY DEPENDENT TIMING MARGIN

(75) Inventors: Qian Cui, San Jose, CA (US); Sandeep Bhutani, Pleasanton, CA (US); Jason R. Potnick, Livermore, CA (US)

(73) Assignee: LSI Corporation, Milpitas, CA (US)

( * ) Notice: Subject to any disclaimer, the term of this patent is extended or adjusted under 35 U.S.C. 154(b) by 321 days.

(21) Appl. No.: 11/037,306

(22) Filed: Jan. 18, 2005

(65) Prior Publication Data

US 2006/0190879 A1   Aug. 24, 2006

(51) Int. Cl.
*G06F 17/50* (2006.01)
(52) U.S. Cl. .................. 716/6; 716/4; 716/5; 703/16
(58) Field of Classification Search ............ 716/4–6; 703/13–17, 19
See application file for complete search history.

(56) References Cited

U.S. PATENT DOCUMENTS

| 5,867,399 | A  | * | 2/1999 | Rostoker et al. | ............ 716/18 |
| 6,097,884 | A  | * | 8/2000 | Sugasawara | .................. 716/4 |
| 6,177,810 | B1 | * | 1/2001 | Loeffler | ...................... 326/87 |
| 6,745,376 | B2 | * | 6/2004 | Fredrickson | .................. 716/6 |
| 7,005,705 | B2 | * | 2/2006 | Maeda et al. | ............... 257/347 |
| 2005/0065765 | A1 | * | 3/2005 | Visweswariah | ............. 703/19 |

\* cited by examiner

*Primary Examiner*—Vuthe Siek
(74) *Attorney, Agent, or Firm*—Luedeka, Neely & Graham

(57) ABSTRACT

A method for determining a timing margin to be applied in an integrated circuit timing design. Circuit simulator path delays and static timing analysis tool path delays are determined for the integrated circuit timing design. The circuit simulator path delays are plotted in a first plot versus a percentage difference between the circuit simulator path delays and the static timing analysis tool path delays, and in a second plot are plotted versus a numerical difference between the circuit simulator path delays and the static timing analysis tool path delays. A first point is identified on the second plot having a largest numerical difference, and the circuit simulator path delay for the first point is identified. A corresponding point on the first plot having the circuit simulator path delay is found, and the percentage difference for the corresponding point is identified. A combination of both the circuit simulator path delay and the percentage difference is used as the timing margin.

9 Claims, 1 Drawing Sheet

US 7,299,435 B2

FREQUENCY DEPENDENT TIMING MARGIN

FIELD

This invention relates to the field of integrated circuit fabrication. More particularly, this invention relates to setting timing margins during the design of integrated circuits.

BACKGROUND

In Static Timing Analysis flow, the timing margin is a very important concept that can absorb uncertainties in the timing analysis. These uncertainties include a delay calculator's accuracy with respect to the golden data from a SPICE simulation, various process variations, extraction noise, and so forth.

There are two general kinds of margin in Static Timing Analysis. One is an end point margin, which is a fixed timing number usually expressed in picoseconds, and which is added to a sequential cell's (flip flop's) setup/hold time in the cell library or used with a set_clock_uncertainty command in static timing analysis tool such as PrimeTime, offered by Synopsis, Inc. of Mountain View Calif. Another type of margin is a path based margin, which is typically expressed as a percentage value that is added by the set_timing_derate command in a static timing analysis tool.

Typically, only one kind of margin is used for one source of uncertainties. For example, path based percent margin is typically used for on chip variation margin. However, using one kind of margin or the other as seems best for different paths tends to be extremely labor intensive, as each path must be individually investigated and the desired margin type applied. On the other hand, using just one of the two types of timing margin as described above for all of the paths tends to create a variety of problems.

What is needed, therefore, is a method by which problems such as those described above can be overcome, at least in part.

SUMMARY

The above and other needs are met by a method for determining a timing margin to be applied in an integrated circuit timing design. Circuit simulator path delays and static timing analysis tool path delays are determined for the integrated circuit timing design. The circuit simulator path delays are plotted in a first plot versus a percentage difference between the circuit simulator path delays and the static timing analysis tool path delays, and in a second plot are plotted versus a numerical difference between the circuit simulator path delays and the static timing analysis tool path delays. A first point is identified on the second plot having a largest numerical difference, and the circuit simulator path delay for the first point is identified. A corresponding point on the first plot having the circuit simulator path delay is found, and the percentage difference for the corresponding point is identified. A combination of both the circuit simulator path delay and the percentage difference is used as the timing margin.

Thus, a mixed endpoint margin and path-based margin is described to improve a delay calculator's accuracy with respect to the circuit simulator. This margin is preferably based on the frequency of a path. Since the static timing analysis engine group timing path is based on clocks and reported based on timing group (the timing group is based on the clocks), the mixed margin can be easily used in static timing analysis flow. The mixed margin tends to reduce extra margin overhead and produces the most compact timing margins. This method can also apply to other margins due to other sources of timing uncertainties.

In various embodiments, the circuit simulator path delay is held constant and the percentage difference is varied to achieve the timing margin. Alternately, the circuit simulator path delay is varied and the percentage difference is held constant to achieve the timing margin. In some embodiment, both the circuit simulator path delay is varied and the percentage difference is varied to achieve the timing margin. Optionally, a critical path delay for the integrated circuit timing design is determined from a frequency of the integrated circuit timing design, and a combination of the circuit simulator path delay and the percentage difference that minimizes the timing margin at the critical path delay is used as the timing margin.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The present invention includes a mixed timing margin that is a specific combination of the fixed and the percentage margins, and which is described herein in regard to one kind of uncertainty, a delay calculator's accuracy. However, this method can be applied to other uncertainties as well. The mixed margin is preferably derived based on a design path's clock frequency. This tends to reduce the unnecessary extra margin that might otherwise be added to a path, and produces a highly efficient margin for the design paths.

Figure 1:
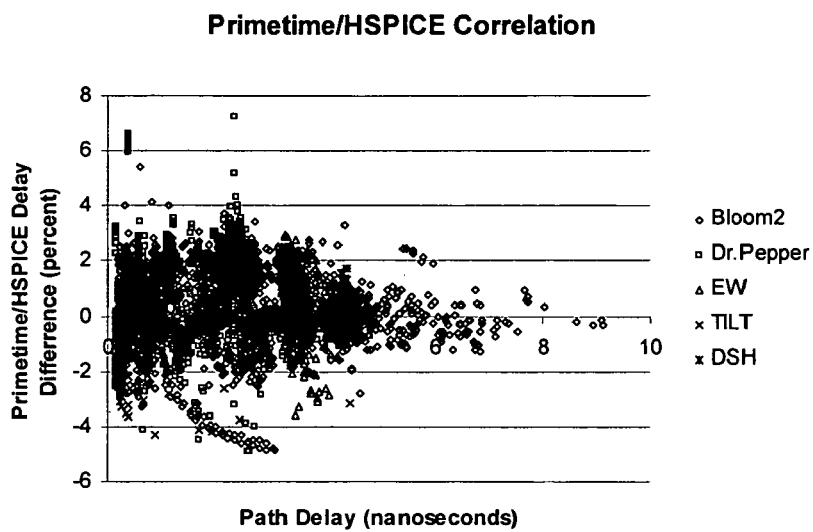
FIG. 1 is a plot of circuit simulator path delays versus percentage difference from circuit simulator and static timing analysis tool path delays.
Figure 2:
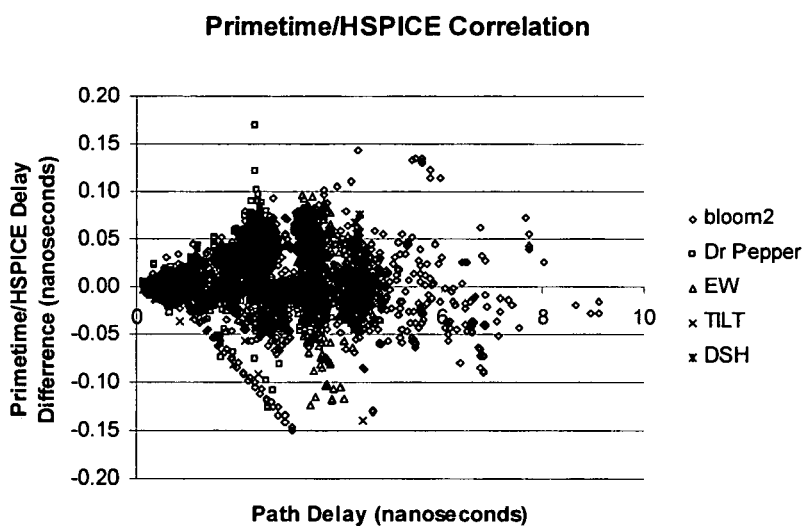
FIG. 2 is a plot of circuit simulator path delays versus absolute difference from circuit simulator and static timing analysis tool path delays.

FIG. 1 and FIG. 2 are circuit simulator correlation plots. A static timing analysis tool routine such as PrimeTime is preferably run on five designs, and the timing is reported in the static timing analysis tool for the top one thousand paths from each path group in each design. A circuit simulator such as HSPICE, also offered by Synopsis, Inc., is then run on these paths to get the path delay circuit simulator timing numbers. The static timing analysis tool reported timing numbers that come out of the static timing analysis tool's internal delay calculator are then compared with the circuit simulator timing numbers.

The X-axis of both plots of FIGS. 1 and 2 is the path delay circuit simulator number in nanoseconds. The Y-axis in FIG. 1 is the percentage difference between the static timing analysis tool path delay number and the circuit simulator path delay number. The Y-axis in FIG. 2 is the absolute timing difference between the static timing analysis tool path delay number and the circuit simulator path delay number in nanoseconds. After the final margin number is acquired and applied, all of the path delay data is preferably larger than the circuit simulator data, for a worst case setup check.

In FIG. 1 it is seen that there is a relatively high percentage of error, about seven percent, for the shorter paths (graphed near the left end of the chart), and a relatively low percentage of error on the longer paths (graphed near the right end of the chart). From FIG. 2 it is seen that the largest absolute error, about one hundred and fifty picoseconds, happens only for a mid-range path. If about one hundred and fifty picoseconds is used for the end point margin only (as indicated from FIG. 2), it would tend to be too conservative for the short path and the long path cases. If seven percent is used as the path based margin only (as indicated from FIG. 1), it would tend to be too conservative for the long path case.

Thus, a mixed margin approach is proposed, which approach preferably balances the margin requirements of both the short path and the long path cases. A mixed margin preferably catches the short paths with end point based margin, and the long paths with path based margin. This mixed margin is preferably derived as given in the steps below, where it is assumed that there are a statistically large enough number of data points for an accurate analysis.

(1) Retrieve from FIG. 2 the maximum absolute delay difference and its corresponding circuit simulator path delay. (2) Use both the circuit simulator path delay number from step 1 and FIG. 1 to get the percentage path based margin corresponding to the circuit simulator path delay. (3) Vary the fixed margin until all the data points are bounded. Use of this approach in the example as depicted results in a five percent path based margin without an end point margin.

The difficulty with the mixed margin approach lies in distributing the correlation error into two kinds of margins. The percentage margin is used at the largest absolute path delay difference point. Another point can also be used for the percentage margin, and the endpoint margin can be adjusted to bound all of the data points. A frequency-based approach is preferably used to find the right balance between these two kinds of margins, in order to add as little margin as possible, and also to bound the correlation errors.

In Static Timing Analysis, path delay numbers are strongly clock cycle dependent (disregarding multi cycle paths and asynchronized paths for the moment). For example, for a 250 Mhz clock path group in a design, the critical path is about four nanoseconds long. The frequency information can be used to find the best-balanced margin for a path group, and this margin can be applied for this particular path group only.

Figure 3:
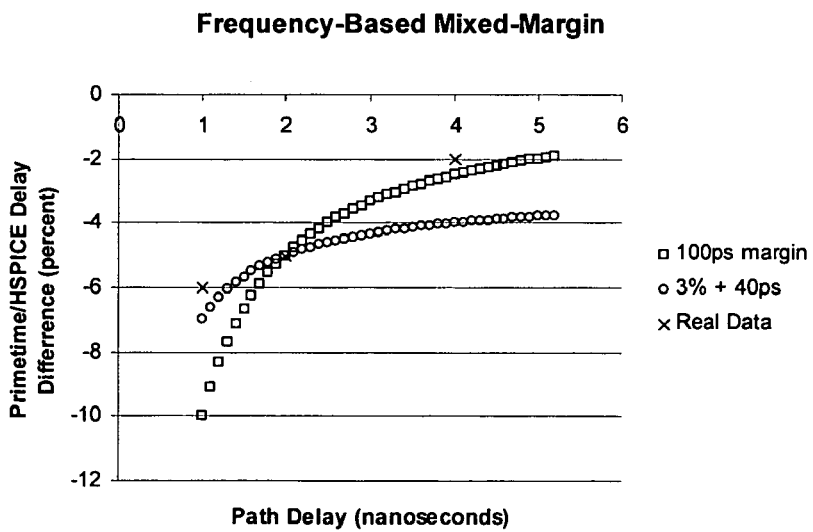
FIG. 3 is a plot of curves that balance percent margin and end point margin.

FIG. 3 is a simplified example of this frequency based mixed margin. For the present example, the three date points are the outer contour of the correlation data plot. At about one nanosecond, there is about sixty picoseconds or about six percent error. At about two nanoseconds, there is about one hundred picoseconds or about five percent error. At about four nanoseconds, there is about eighty picoseconds or about two percent error.

If end point margin is used only, it would be about one hundred picoseconds, which is the largest error number. If path-based margin is used only, it would be about six percent, which is the largest percent error number. However, If the mixed margin approach as described herein is used, there is a five percent margin (which is the percentage associated with the larges absolute error) plus a ten picosecond margin (which is what is required to bound the error at one nanosecond) for the entire design. However, the following mixed margins are all valid margins that can bound the whole correlation data points: four percent plus twenty picoseconds, three percent plus forty picoseconds, two percent plus sixty picoseconds, and one percent plus eighty picoseconds.

With a 500 MHz design, the critical path is about two nanoseconds. One percent of that is twenty picoseconds. In this case, a mixed margin of four percent plus twenty picoseconds is ten picoseconds better than five percent plus twenty picoseconds. For a 250 MHz design, the critical path is about four nanoseconds. One percent of that is forty picoseconds. In this case, a mixed margin of one percent plus eighty picoseconds is twenty picoseconds better than two percent plus sixty picoseconds.

Most preferably, only data with path delay numbers near critical are considered, because adding margin to a path which is near critical would tend to create new timing violations. For example, a one nanosecond path typically isn't critical for a 250 MHz design that has four nanosecond critical path timing.

The following method is preferably used to get a frequency based mixed margin with a correlation plot. (1) Determine the target frequency. (2) Estimate the critical path delay range, selectively accounting for setup time and clock skew.

For example, the delay number based on target frequency of five hundred megahertz is about two nanoseconds, and for a target frequency of two hundred and fifty megahertz is about four nanoseconds. The setup time of the flip flop is subtracted, and the positive/negative clock skew number is appropriately subtracted/added to get the critical path delay. Any path in this clock group with a delay number larger than this critical path delay number is designated as a violated path, which needs to be fixed. A real path delay plus the margin number preferably does not exceed the critical delay number. This is the critical path delay range.

The graph in FIG. 3 is a simplified example, with only three real data points, of the graph of FIG. 1. The first curve in FIG. 3 is a margin which corresponds to a one hundred picosecond margin at various path delay numbers. If other margins are used, the curve will be different, but the margin curves preferably bound all the data points. The goal is preferably to find the margin number that is a minimum for the critical path delay we calculated from step 2 from all possible margins.

FIG. 3 also depicts another curve that corresponds to a mixed margin according to the present invention of three percent plus forty picoseconds. The two curves both bound the three data points, but do so in a slightly different manner. They are about the same at the two nanosecond point, which is the critical path delay in this example, but the three percent curve is more compact at smaller delay numbers, whereas the one hundred picosecond curve is more compact at larger delay numbers. All of the various mixed margin combinations can be plotted to find the most compact curve, based on the critical path delay number calculated in step 2, by using the curve with a delay X axis number that is smaller than the critical path delay number.

(3) Find the path based margin and end point margin combination with an overall margin that not only bounds all the data points, but also has a minimum penalty for the critical path delay.

Preferably, only data points with circuit simulator delay numbers smaller than the critical path delay need be accounted for, since those larger delay number data points would not appear for paths of this clock frequency. The mixed margin is preferably applied to each data point at the outer boundary of the correlation data. These margins are compared and a margin is identified which preferably bounds all other data points and gives minimum margin penalty for the given frequency. Another benefit is that this approach can be easily automated with a small program.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for determining a timing margin to be applied in an integrated circuit timing design, the method comprising the steps of:
   determine circuit simulator path delays for the integrated circuit timing design,
   determine static timing analysis tool path delays for the integrated circuit timing design,
   plot in a first plot the circuit simulator path delays versus a percentage difference between the circuit simulator path delays and the static timing analysis tool path delays,
   plot in a second plot the circuit simulator path delays versus a numerical difference between the circuit simulator path delays and the static timing analysis tool path delays,
   identify a first point on the second plot having a largest numerical difference,
   identify the circuit simulator path delay for the first point,
   find a corresponding point on the first plot having the circuit simulator path delay,
   identify the percentage difference for the corresponding point, and
   produce the timing margin by adjusting at least one of the circuit simulator path delay and the percentage difference.

2. The method of claim 1, wherein the circuit simulator path delay is held constant and the percentage difference is varied to achieve the timing margin.

3. The method of claim 1, wherein the circuit simulator path delay is varied and the percentage difference is held constant to achieve the timing margin.

4. The method of claim 1, wherein the circuit simulator path delay is varied and the percentage difference is varied to achieve the timing margin.

5. The method of claim 1, further comprising determining a critical path delay for the integrated circuit timing design from a frequency of the integrated circuit timing design and using as the timing margin a combination of the circuit simulator path delay and the percentage difference as the timing margin that minimizes the timing margin at the critical path delay.

6. A method for determining a timing margin to be applied in an integrated circuit timing design, the method comprising the steps of:
   determine circuit simulator path delays for the integrated circuit timing design,
   determine static timing analysis tool path delays for the integrated circuit timing design,
   plot in a first plot the circuit simulator path delays versus a percentage difference between the circuit simulator path delays and the static timing analysis tool path delays,
   plot in a second plot the circuit simulator path delays versus a numerical difference between the circuit simulator path delays and the static timing analysis tool path delays,
   identify a first point on the second plot having a largest numerical difference,
   identify the circuit simulator path delay for the first point,
   find a corresponding point on the first plot having the circuit simulator path delay,
   identify the percentage difference for the corresponding point, and
   use a combination of both the circuit simulator path delay and the percentage difference as the timing margin,
   wherein the circuit simulator path delay is held constant and the percentage difference is varied to achieve the timing margin.

7. The method of claim 6, further comprising determining a critical path delay for the integrated circuit timing design from a frequency of the integrated circuit timing design and using as the timing margin a combination of the circuit simulator path delay and the percentage difference as the timing margin that minimizes the timing margin at the critical path delay.

8. A method for determining a timing margin to be applied in an integrated circuit timing design, the method comprising the steps of:
   determine circuit simulator path delays for the integrated circuit timing design,
   determine static timing analysis tool path delays for the integrated circuit timing design,
   plot in a first plot the circuit simulator path delays versus a percentage difference between the circuit simulator path delays and the static timing analysis tool path delays,
   plot in a second plot the circuit simulator path delays versus a numerical difference between the circuit simulator path delays and the static timing analysis tool path delays,
   identify a first point on the second plot having a largest numerical difference,
   identify the circuit simulator path delay for the first point,
   find a corresponding point on the first plot having the circuit simulator path delay,
   identify the percentage difference for the corresponding point, and
   use a combination of both the circuit simulator path delay and the percentage difference as the timing margin,
   wherein the circuit simulator path delay is varied and the percentage difference is held constant to achieve the timing margin.

9. The method of claim 8, further comprising determining a critical path delay for the integrated circuit timing design from a frequency of the integrated circuit timing design and using as the timing margin a combination of the circuit simulator path delay and the percentage difference as the timing margin that minimizes the timing margin at the critical path delay.

* * * * *